(12) United States Patent  (10) Patent No.: US 8,446,764 B2
Kwon  (45) Date of Patent: May 21, 2013

(54) CONTROL VOLTAGE GENERATION CIRCUIT AND NON-VOLATILE MEMORY DEVICE INCLUDING THE SAME

(75) Inventor: Lee-Hyun Kwon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 186 days.

(21) Appl. No.: 13/101,522

(22) Filed: May 5, 2011

(65) Prior Publication Data
US 2012/0188822 A1 Jul. 26, 2012

(30) Foreign Application Priority Data

Jan. 26, 2011 (KR) .......................... 10-2011-0007738

(51) Int. Cl.
*G11C 11/34* (2006.01)
(52) U.S. Cl.
USPC ............ 365/185.03; 365/185.18; 365/185.23; 365/185.27
(58) Field of Classification Search
USPC .............. 365/185.03, 185.18, 185.23, 185.27
See application file for complete search history.

(56) References Cited

U.S. PATENT DOCUMENTS

| 6,240,017 | B1 * | 5/2001 | Le et al. ................... | 365/185.18 |
| 7,257,031 | B2 * | 8/2007 | Darrer ...................... | 365/185.23 |
| 8,000,151 | B2 * | 8/2011 | Yamada et al. .......... | 365/185.27 |
| 8,154,945 | B2 * | 4/2012 | Wang et al. .............. | 365/185.23 |
| 8,315,104 | B2 * | 11/2012 | Futatsuyama et al. ... | 365/185.18 |

FOREIGN PATENT DOCUMENTS

KR 1020080054333 6/2008

OTHER PUBLICATIONS

Notice of Allowance issued by the Korean Intellectual Property Office on Jan. 28, 2013.

* cited by examiner

*Primary Examiner* — Trong Phan
(74) *Attorney, Agent, or Firm* — IP & T Group LLP (57) ABSTRACT

A control voltage generation circuit for generating a control voltage for controlling a high-voltage transistor includes an input node configured to receive a first enable signal; an output node configured to generate the control voltage, a transferor configured to transfer a voltage of the input node to the output node in response to a transfer signal, an enabling voltage driver configured to drive the output node with a high voltage when the first enable signal is enabled, and a disabling voltage driver configured to drive the output node with a negative voltage when a second enable signal is enabled in a negative mode.

19 Claims, 4 Drawing Sheets

CONTROL VOLTAGE GENERATION CIRCUIT AND NON-VOLATILE MEMORY DEVICE INCLUDING THE SAME

CROSS-REFERENCE TO RELATED APPLICATIONS

The present application claims priority of Korean Patent Application No. 10-2011-0007738, filed on Jan. 26, 2011, which is incorporated herein by reference in its entirety.

BACKGROUND

1. Field of the Invention

Exemplary embodiments of the present invention relate to a non-volatile memory device.

2. Description of the Related Art

Non-volatile memory devices retain data stored therein although a power source has been cut off. Among the non-volatile memory devices, floating gate-type non-volatile memory devices, which are referred to as non-volatile memory devices hereafter, are usually used at present. A floating gate-type non-volatile memory device is disposed over a channel region of a substrate and it is driven by using a floating gate insulated from the channel region. In particular, the floating gate-type non-volatile memory device is driven as the threshold voltage of a memory cell shifts by controlling the amount of charges sustained in a conductive band of the floating gate.

A non-volatile memory device includes a memory cell array which stores data. The memory cell array includes a plurality of memory cell blocks. Each memory cell block includes a plurality of pages, and each page includes a plurality of memory cells. The memory cells are divided into on-cells and off-cells according to the distribution of threshold voltage. On-cells are erased cells and off-cells are programmed cells. The non-volatile memory device performs an erase operation on a memory block basis, and performs a write or read operation on a page basis.

Meanwhile, a non-volatile memory device may store one-bit data or data of more than two bits in one memory cell. Generally, a memory cell storing one-bit data is referred to as a single level cell (SLC) and a memory cell storing data of more than two bits is referred to as a multi-level cell (MLC). A single level cell has an erase state and a program state according to a threshold voltage. A multi-level cell has an erase state and a plurality of program states according to a threshold voltage.

As for a non-volatile memory device having multi-level cells, it is important to make the width of a threshold voltage distribution region narrow to secure a margin between program states. Generally, a memory cell of a non-volatile memory device having multi-level cells stores 2-bit data or 3-bit data. Herein, the performance and reliability of the non-volatile memory device having multi-level cells may be improved by setting the threshold voltage level of some of the program states and the erase state to a negative voltage level.

Meanwhile, a plurality of memory cells included in one block are coupled with a plurality of word lines through a plurality of high-voltage transistors. When the block is selected, the voltages of the word lines are transferred to a plurality of local lines coupled with the memory cells through the high-voltage transistors. When the block is not selected, the voltages of the word lines are cut off by the high-voltage transistors.

When the threshold voltages of the memory cells have a positive distribution, it is possible to transfer or cut off the voltages of the word lines just by applying a voltage higher than a ground voltage to the high-voltage transistors. However, as the threshold voltages of the memory cells include a negative distribution, it may not be possible to cut off the voltages of the word lines just by applying a voltage higher than a ground voltage to the high-voltage transistors.

SUMMARY

An exemplary embodiment of the present invention is directed to a non-volatile memory device in which a plurality of high-voltage transistors electrically connect or disconnect a plurality of word lines from a cell block, when the threshold voltage distribution of memory cells include a negative voltage.

In accordance with an exemplary embodiment of the present invention, a control voltage generation circuit for generating a control voltage for controlling a high-voltage transistor includes an input node configured to receive a first enable signal, an output node configured to generate the control voltage, a transferor configured to transfer a voltage of the input node to the output node in response to a transfer signal, an enabling voltage driver configured to drive the output node with a high voltage when the first enable signal is enabled, and a disabling voltage driver configured to drive the output node with a negative voltage when a second enable signal is enabled in a negative mode.

The transferor may include a first high-voltage NMOS transistor coupled between the input node and the output node and may receive the transfer signal at its gate.

The enabling voltage driver may include a high-voltage PMOS transistor which is turned on/off in response to the first enable signal, and an NMOS transistor which is turned on/off in response to the control voltage.

The disabling voltage driver may include a disabling voltage supply node configured to which receives a disabling voltage, and a second high-voltage NMOS transistor coupled between the output node and the disabling voltage supply node and configured to receive the second enable signal at its gate.

The control voltage generation circuit may further include a transfer signal generator configured to generate the transfer signal.

In accordance with another exemplary embodiment of the present invention, a non-volatile memory device include a cell block having a plurality of cells, a plurality of global lines, a plurality of high-voltage transistors configured to transfer voltages of the global lines to a plurality of local lines inside the cell block, an input node configured to receive a first enable signal applied when the cell block is selected, an output node configured to generate a control voltage for controlling the high-voltage transistors, a transferor configured to transfer a voltage of the input node to the output node in response to a transfer signal, an enabling voltage driver configured to drive the output node with a high voltage when the first enable signal is enabled, and a disabling voltage driver configured to drive the output node with a negative voltage when a second enable signal is enabled in a negative mode.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
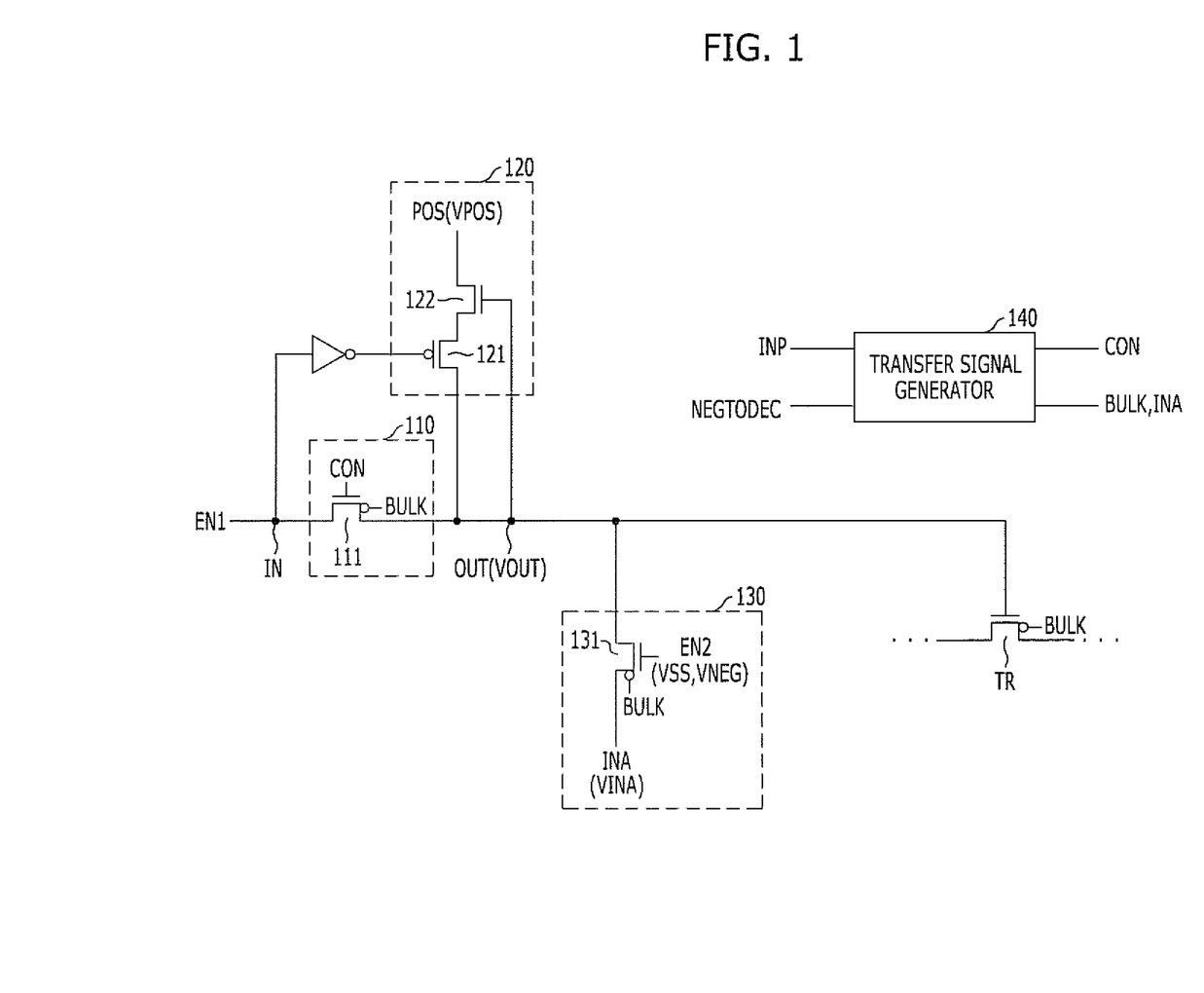
FIG. 1 is a circuit diagram of a control voltage generation circuit in accordance with an exemplary embodiment of the present invention.

Hereafter, a high voltage level is the level of a signal for turning on an NMOS transistor and turning off a PMOS transistor, and a low voltage level is the level of a signal for turning off an NMOS transistor and turning on a PMOS transistor FIG. 1 is a circuit diagram showing a control voltage generation circuit in accordance with an exemplary embodiment of the present invention.

Referring to FIG. 1, the control voltage generation circuit for generating a control voltage VOUT for controlling a high-voltage transistor TR includes an input node IN to which a first enable signal EN1 is applied, an output node OUT in which a control voltage VOUT is generated, a transferor 110, an enabling voltage driver 120, and a disabling voltage driver 130. The transferor 110 transfers the voltage of the input node IN to the output node OUT in response to a transfer signal CON. The enabling voltage driver 120 drives the output node OUT with a high voltage VPOS when the first enable signal EN1 is enabled. The disabling voltage driver 130 drives the output node OUT with a negative voltage VNEG when a second enable signal EN2 is enabled in a negative mode. Also, the control voltage generation circuit includes a transfer signal generator 140 for generating a transfer signal CON.

The transferor 110 is coupled between the input node IN and the output node OUT, and the transferor 110 includes a first high-voltage NMOS transistor 111, which receives the transfer signal CON at its gate.

The enabling voltage driver 120 includes a high-voltage PMOS transistor 121, which is turned on/off in response to the first enable signal EN1, and an NMOS transistor 122, which is turned on/off in response to the control voltage VOUT. Herein, the NMOS transistor 122 is coupled to a high-voltage supply node POS to which a high voltage VPOS is supplied.

The disabling voltage driver 130 is coupled to a disabling voltage supply node INA to which a disabling voltage VINA is supplied. The disabling voltage driver 130 includes a second high-voltage NMOS transistor 131 which is coupled between the output node OUT and the disabling voltage supply node INA and receives the second enable signal EN2 at its gate.

The transfer signal generator 140 generates the transfer signal CON for controlling the transferor 110 for electrically connecting or disconnecting the input node IN to the output node OUT according to a given condition. The structure and operation of the transfer signal generator 140 will be described in detail with reference to FIG. 3.

Hereafter, the operation of the control voltage generation circuit is described with reference to FIG. 1.

A high-voltage transistor TR is turned on/off in response to the control voltage VOUT inputted through its gate. Hereafter, a case where the control voltage generation circuit operates (1) in a normal mode and a case where the control voltage generation circuit operates (2) in a negative mode are described separately. In each transistor, a part denoted with 'BULK' is a part where a voltage is supplied to a bulk region of the transistor.

(1) A case in which the control voltage generation circuit operates in the normal mode A normal mode is an operation mode in which a ground voltage VSS is applied to a gate of the high-voltage transistor TR to turn off the high-voltage transistor TR. In the normal mode, the ground voltage VSS is applied to the BULK part of the high-voltage transistor TR.

1) A first case of the normal mode where the control voltage VOUT is generated to turn on the high-voltage transistor TR:

When the first enable signal EN1 is enabled to a logic high level, the high-voltage PMOS transistor 121 is turned on. When the first enable signal EN1 is enabled to a logic high level, the level of the transfer signal CON becomes a positive voltage level, which is a logic high voltage level. As a result, the first high-voltage NMOS transistor 111 is turned on and the input node IN and the output node OUT are electrically connected to each other. Thus, the voltage of the input node IN is transferred to the output node OUT. Therefore, the control voltage VOUT becomes a power source voltage VDD. Herein, the level of the positive voltage is the same as the level of the power source voltage VDD.

When the control voltage VOUT becomes the power source voltage VDD, the NMOS transistor 122 is turned on and the high-voltage PMOS transistor 121 is turned on in response to a low level signal obtained as the first enable signal EN1 passes through an inverter. Therefore, the high-voltage supply node POS and the output node OUT are electrically connected.

Since a high voltage VPOS which is higher than a high voltage level is applied to the high-voltage supply node POS, the output node OUT is driven with the high voltage VPOS when the first enable signal EN1 is enabled. In short, the level of the control voltage VOUT is raised to the level of the high voltage VPOS. The high-voltage transistor TR is turned on in response to the control voltage VOUT having the level of the high voltage VPOS.

Herein, when the first enable signal EN1 is enabled, the second enable signal EN2 is disabled. That is, the second enable signal EN2 becomes the disabling level, which is the ground voltage VSS. Therefore, the second high-voltage NMOS transistor 131 is turned off. In short, the disabling voltage driver 130 does not affect the output node OUT.

2) A second case of the normal mode where the control voltage VOUT for turning off the high-voltage transistor TR is generated:

When the first enable signal EN1 is disabled to a logic low level, the high-voltage PMOS transistor 121 which receives a high level signal obtained as the first enable signal EN1 passes through an inverter is turned off. Therefore, the enabling voltage driver 120 is disabled and thus it does not affect the output node OUT.

When the first enable signal EN1 is disabled, the second enable signal EN2 is enabled to a logic high level. When the second enable signal EN2 is enabled to a logic high level, the second high-voltage NMOS transistor 131 is turned on and the output node OUT and the disabling voltage supply node INA are electrically connected to each other. The level of the disabling voltage VINA applied to the disabling voltage supply node INA in the normal mode is a ground voltage VSS level. Therefore, the output node OUT is driven with the ground voltage VSS and the control voltage VOUT becomes the ground voltage VSS. The high-voltage transistor TR is turned off in response to the control voltage VOUT having the level of the ground voltage VSS.

(2) A case in which the control voltage generation circuit operates in the negative mode The negative mode is an operation mode in which a negative voltage VNEG is applied to a gate of the high-voltage transistor TR to turn off the high-voltage transistor TR. When the control voltage VOUT for turning on the high-voltage transistor TR is generated in the negative mode, the ground voltage VSS is applied to the bulk part, and when the control voltage VOUT for turning off the high-voltage transistor TR is generated, the negative voltage VNEG is applied to the bulk part.

1) A first case of the negative mode where the control voltage VOUT for turning on the high-voltage transistor TR is generated:

The operation in this case is the similar to the operation of the control voltage generation circuit in the first case of the normal mode. That is, the level of the control voltage VOUT becomes a high voltage level, and the high-voltage transistor TR is then turned on.

2) A second case of the negative mode where the control voltage VOUT for turning off the high-voltage transistor TR is generated:

When the first enable signal EN1 is disabled to a logic low level, the high-voltage PMOS transistor 121 is turned off. In order to turn off the first high-voltage NMOS transistor 111 in the negative mode and electrically disconnect the input node IN from the output node OUT, the level of the transfer signal CON should be the level of negative voltage VNEG.

When the level of the transfer signal CON is not the level of the negative voltage VNEG, but rather, the level of the ground voltage VSS, the first high-voltage NMOS transistor 111 is turned on and the input node IN and the output node OUT are electrically connected. As a result, the control voltage VOUT generated in the output node OUT becomes the ground voltage VSS since the first enable signal EN1 of the ground voltage VSS, i.e., a logic low level, is transferred to the output node OUT from the input node IN through the first high-voltage NMOS transistor 111. In this case, the enabling voltage driver 120 is disabled and thus it does not affect the output node OUT.

When the first enable signal EN1 is disabled, the second enable signal EN2 is enabled to a logic high level. When the second enable signal EN2 is enabled to a logic high level, the second high-voltage NMOS transistor 131 is turned on, and the output node OUT and the disabling voltage application node INA are electrically connected. The level of the disabling voltage VINA applied to the disabling voltage application node INA in the negative mode is a negative voltage VNEG level. Therefore, the output node OUT is driven with the negative voltage VNEG and the control voltage VOUT becomes the negative voltage VNEG. As a result, the high-voltage transistor TR is turned off in response to the control voltage VOUT having the level of negative voltage VNEG.

A control voltage generation circuit in accordance with another exemplary embodiment of the present invention makes the control signal VOUT be one level among a positive voltage, the ground voltage VSS, and the negative voltage VNEG according to the operation mode and the levels of the first enable signal EN1 and the second enable signal EN2 so as to generate accurate control voltage VOUT. In particular, in a case where the control voltage VOUT is made to be the negative voltage VNEG in the negative mode, when the control voltage VOUT is not the negative voltage VNEG, the first high-voltage NMOS transistor 111 is turned on and the input node IN and the output node OUT are electrically connected. In this case, since the first enable signal EN1 is in a logic low level, which is the ground voltage VSS, the ground voltage VSS is applied to the output node OUT as well. Also, as the negative voltage VNEG of the output node OUT is transferred to the input node IN, devices may be damaged undesirably. The exemplary embodiment of the present invention may prevent the above-described concerns by more effectively controlling the level of the control voltage VOUT.

Figure 2:
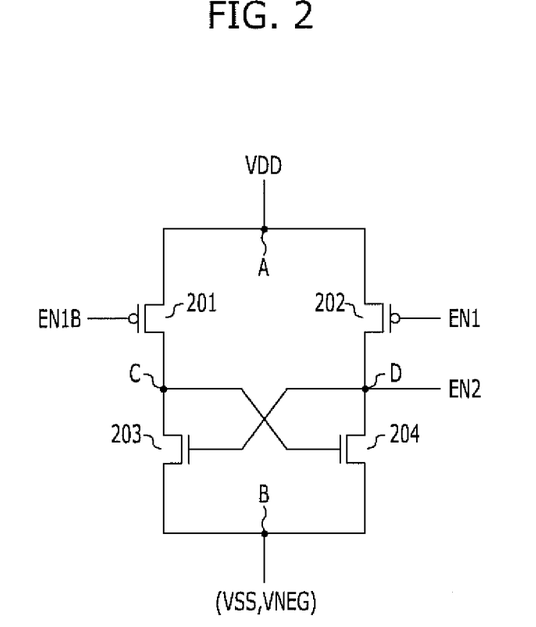
FIG. 2 is a diagram showing a circuit for generating a second enable signal EN2.

FIG. 2 is a circuit diagram showing a circuit for generating a second enable signal EN2.

Referring to FIG. 2, the circuit for generating the second enable signal EN2 includes a first PMOS transistor 201, a second PMOS transistor 202, a first high-voltage NMOS transistor 203, and a second high-voltage NMOS transistor 204. The power source voltage VDD is applied to a first external node A, regardless of the operation mode, and the ground voltage VSS is applied to a second external node B in the normal mode. The negative voltage VNEG is applied to the second external node B in the negative mode. The first PMOS transistor 201 is coupled to the first high-voltage NMOS transistor 203 through a first internal node C, and the second PMOS transistor 202 is coupled to the second high-voltage NMOS transistor 204 through a second internal node D. The second enable signal EN2 is generated at the second internal node D.

As described above, the second enable signal EN2 has an opposite logic value to that of the first enable signal EN1. In other words, when the first enable signal EN1 is enabled, the second enable signal EN2 is disabled, and when the first enable signal EN1 is disabled, the second enable signal EN2 is enabled. However, since the level of the second enable signal EN2 may be different according to the operation mode when the second enable signal EN2 is disabled, such second enable signal EN2 may be generated from the structure illustrated in FIG. 2. This corresponds to a typical level shifter circuit.

A process of generating the second enable signal EN2 will be described in detail, hereafter, with reference to FIG. 2.

(1) The Normal Mode

A third enable signal EN1B is applied to the gate of the first PMOS transistor 201, and the first enable signal EN1 is applied to the gate of the second PMOS transistor 202. The third enable signal EN1B is an inverted signal of the first enable signal EN1 obtained by inverting the first enable signal EN1.

When the first enable signal EN1 is enabled to a logic high level, the first PMOS transistor 201 is turned on, and the second PMOS transistor 202 is turned off. When the first PMOS transistor 201 is turned on, the first external node A and the first internal node C are electrically connected. Therefore, the power source voltage VDD is transferred to the first internal node C.

The second high-voltage NMOS transistor 204 is turned on in response to the voltage of the first internal node C. When the second high-voltage NMOS transistor 204 is turned on, the second internal node D and the second external node B are electrically connected. Therefore, the ground voltage VSS is transferred to the second internal node D. The first high-voltage NMOS transistor 203 is turned off in response to the voltage of the second internal node D. Therefore, the second enable signal EN2 is disabled and the disabled level thereof is the level of the ground voltage VSS.

When the first enable signal EN1 is disabled to a logic low level, the operation is performed in opposite to what is described above, and the first PMOS transistor 201 is turned off, and the second PMOS transistor 202 is turned on. Also, the first high-voltage NMOS transistor 203 is turned on, and the second high-voltage NMOS transistor 204 is turned off. Therefore, the ground voltage VSS is transferred to the first internal node C, and the power source voltage VDD is transferred to the second internal node D. That is, the second enable signal EN2 is enabled with power source voltage VDD.

(2) The Negative Mode

In a case where an operation is performed in the negative mode, when the first enable signal EN1 is enabled or disabled, the transistors 201, 202, 203 and 204 are turned on/off in the same way as described above. However, the negative voltage VNEG is applied to the second external node B. Therefore, when the first enable signal EN1 is enabled and the second enable signal EN2 is disabled, the disabled level of the second enable signal EN2 becomes the level of the negative voltage VNEG.

Figure 3:
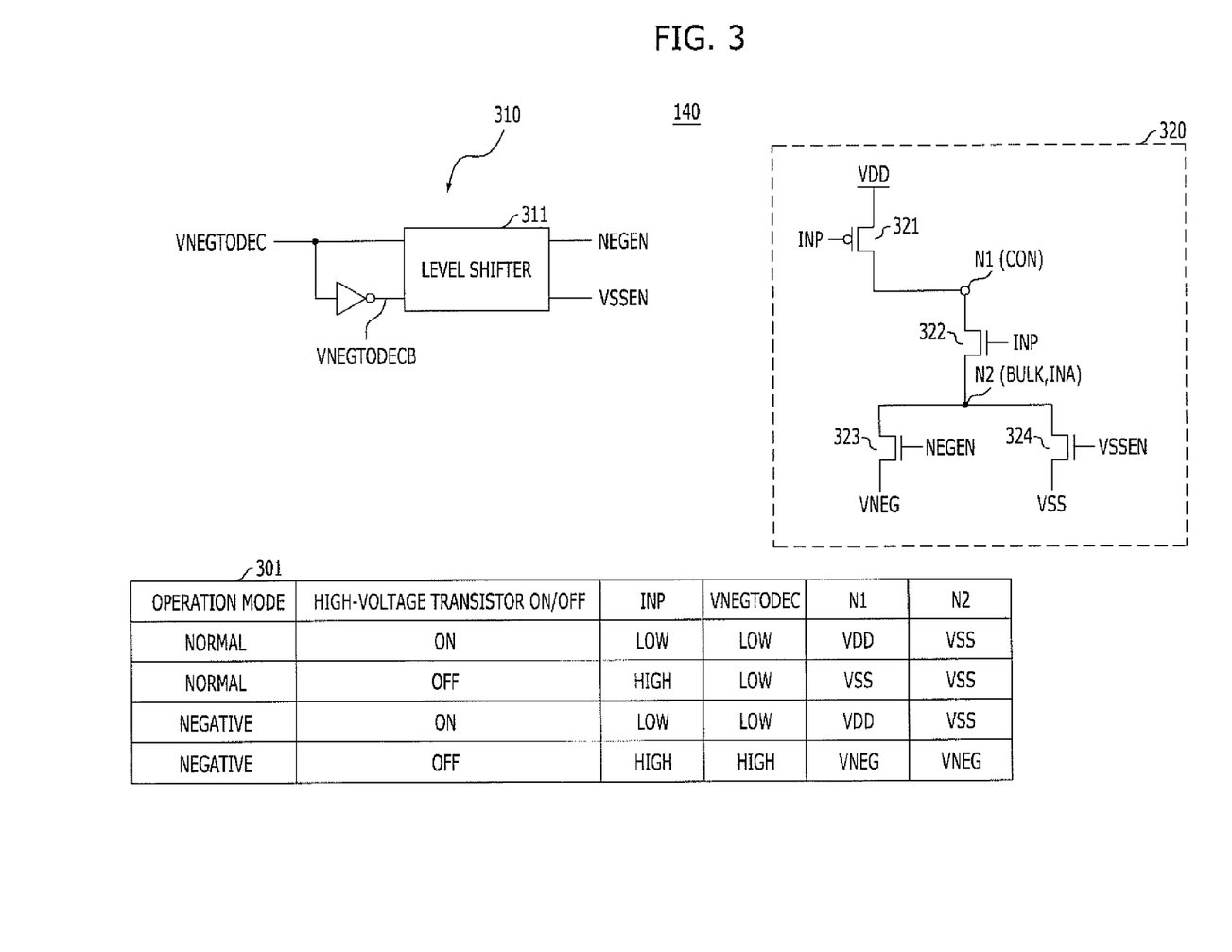
FIG. 3 is a diagram illustrating a configuration and operation of a transfer signal generator 140.

FIG. 3 is a diagram illustrating a configuration and operation of a transfer signal generator 140.

Referring to FIG. 3, the transfer signal generator 140 includes a level shifting unit 310 and a signal generation unit 320. Table 301 shows relationships between logic values of signals INP and VNEGTODEC, that are used in the transfer signal generator 140, and voltages of first and second nodes N1 and N2, according to the operation mode and turn-on/off status of the high-voltage transistor TR. Herein, 'INP' denotes the on/off status of the high-voltage transistor TR, and 'VNEGTODEC' denotes whether the negative voltage VNEG is used or not.

The level shifting unit 310 includes a level shifter 311 which has a similar configuration and operation to the level shifter shown in FIG. 2. Herein, the power source voltage VDD is applied to the first external node A, and the negative voltage VNEG is applied to the second external node B. Also, the signal 'VNEGTODEC' may be applied to the gate of the first PMOS transistor, e.g., 201 as shown in FIG. 2, and 'VNEGTODECB' which is a signal having an opposite logic value to that of the 'VNEGTODEC' is applied to the gate of the second PMOS transistor, e.g., 202. Then, 'VSSEN' is generated in the first internal node C as shown in FIG. 2, and 'NEGEN' is generated in the second internal node D.

Specifically, when the signal 'VNEGTODEC' has a logic low level, the signal 'NEGEN' becomes the negative voltage VNEG, and the level of the signal 'VSSEN' becomes the power source voltage VDD. When the signal 'VNEGTODEC' has a logic high level, the level of the signal 'NEGEN' becomes the power source voltage VDD, and the level of the signal 'VSSEN' becomes the negative voltage VNEG.

The signal generation unit 320 includes a PMOS transistor 321 and first to third NMOS transistors 322, 323 and 324. The transfer signal CON is generated at the first node N1, and the disabling voltage application node INA and the voltage to be applied to BULK are generated at the second node N2.

When the signal 'VNEGTODEC' has a logic low level, the level of the signal 'NEGEN' becomes the negative voltage VNEG, and the second NMOS transistor 323 is turned off. Because the signal 'VSSEN' has the power source voltage VDD, the third NMOS transistor 324 is turned on and thus the voltage of the second node N2 becomes the ground voltage VSS. When the signal 'WNEGTODEC' has a logic high level, the level of the signal 'NEGEN' becomes the power source voltage VDD. Thus, the second NMOS transistor 323 is turned on. Since the signal 'VSSEN' has the negative voltage VNEG, the third NMOS transistor 324 is turned off. Thus, the voltage of the second node N2 becomes the negative voltage VNEG.

Subsequently, when a signal 'INP' has a logic low level, the PMOS transistor 321 is turned on and the first NMOS transistor 322 is turned off. Thus, the voltage of the first node N1 becomes the power source voltage VDD. When the signal 'IMP' has a logic high level, the PMOS transistor 321 is turned off and the first NMOS transistor 322 is turned on. Thus, the voltage of the first node N1 becomes the same as the voltage of the second node N2. Herein, when the negative voltage VNEG is applied to the gate of a transistor, the negative voltage VNEG has to be applied to the bulk region as well.

As shown in Table 301, when the operation mode is the normal mode and the high-voltage transistor TR is turned on, the 'INP' and the 'VNEGTODEC' are both low. When the operation mode is the normal mode and the high-voltage transistor TR is turned off, the 'INP' and the 'VNEGTODEC' are high and low, respectively.

When the operation mode is the negative mode and the high-voltage transistor TR is turned on, each of the signals 'INP' and 'VNEGTODEC' has a logic low level. When the operation mode is the negative mode and the high-voltage transistor TR is turned off, each of the signals 'IMP' and 'VNEGTODEC' has a logic high level. There is no case where the signals 'INP' and the 'VNEGTODEC' have logic low and high levels, respectively.

When the signals 'INP' and 'VNEGTODEC' have a logic low level, the voltage of the first node N1 is the power source voltage VDD, and the voltage of the second node N2 is the ground voltage VSS. When the signals 'INP' and 'VNEGTO-DEC' have a logic low level, the voltages of the first node N1 and the second node N2 are all ground voltage VSS. When the signals 'INP' and 'VNEGTODEC' have a logic high level and a logic low level, respectively, the voltages of the first node N1 and the second node N2 are all ground voltage VSS. When the signals 'INP' and 'VNEGTODEC' have a logic high level, the voltages of the first node N1 and the second node N2 are all negative voltage VNEG.

The transfer signal generator 140 may have a different configuration from that shown in FIG. 3, as long as the level of the transfer signal CON is the same as that of the transfer signal generator 140 shown in FIG. 3 according to the operation mode and the turn-on/off status of the high-voltage transistor TR.

Figure 4:
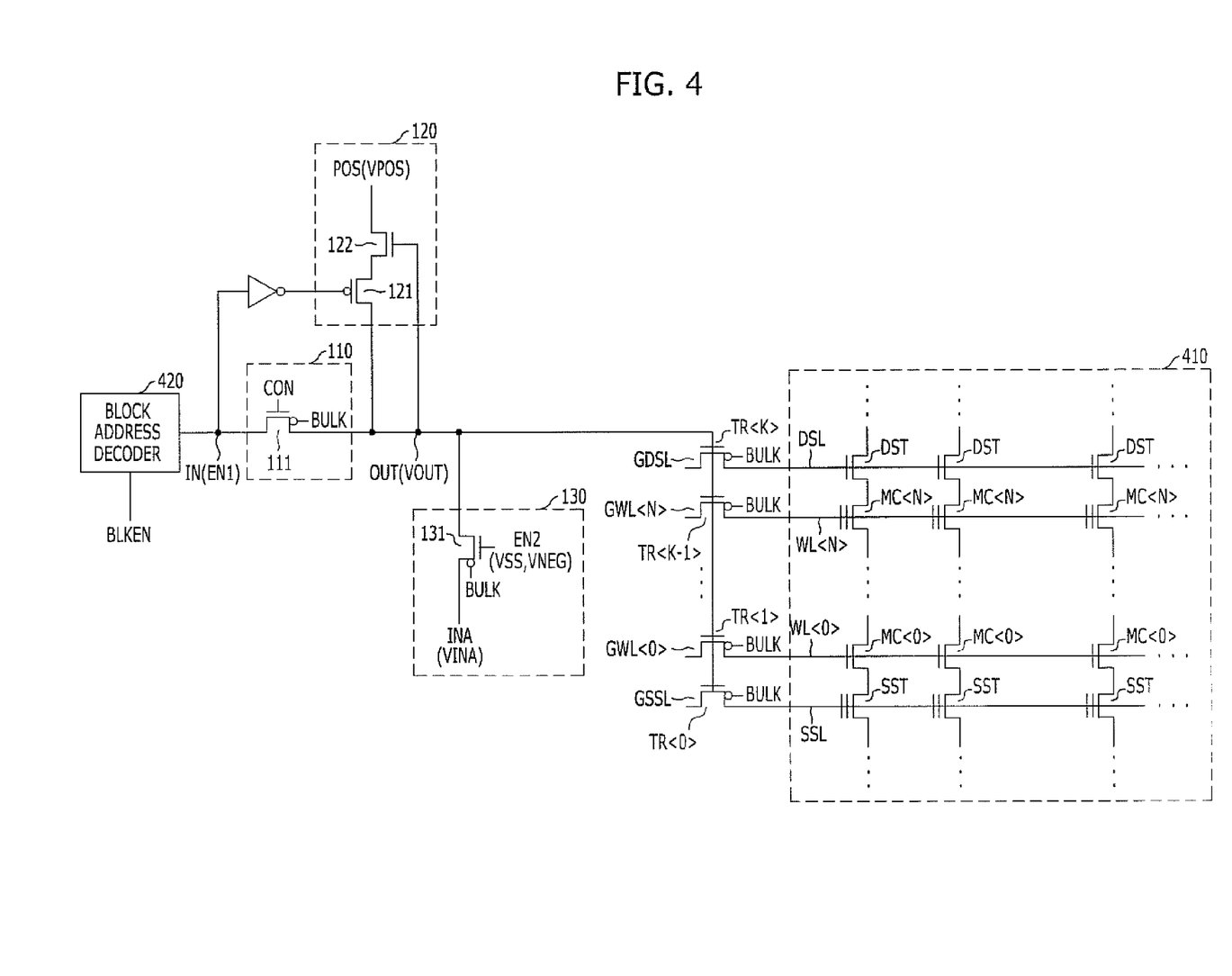
FIG. 4 is a circuit diagram showing a non-volatile memory device in accordance with an exemplary embodiment of the present invention.

FIG. 4 is a circuit diagram showing a non-volatile memory device in accordance with an exemplary embodiment of the present invention.

Referring to FIG. 4, the non-volatile memory device includes a cell block 410, a plurality of global lines GWL<0: N>, GDSL and GSSL, a plurality of high-voltage transistors TR<0:K>, an input node IN, an output node OUT, a transferor 110, an enabling voltage driver 120, and a disabling voltage driver 130. The cell block 410 includes a plurality of cells MC<0:N>, DST and SST. The high-voltage transistors TR<0: K> transfer the voltages of the global lines GWL<0:N>, GDSL and GSSL to a plurality of local lines WL<0:N>, DSL and SSL in the inside of the cell block 410. The input node IN receives a first enable signal EN1 which is enabled when the cell block 410 is selected. The output node OUT generates a control voltage VOUT for controlling the high-voltage transistors TR<0:K>. The transferor 110 transfers the voltage of the input node IN to the output node OUT in response to the transfer signal CON. The enabling voltage driver 120 drives the output node OUT with a high voltage VPOS when the first enable signal EN1 is enabled. The disabling voltage driver 130 drives the output node OUT with the negative voltage VNEG when a second enable signal EN2 is enabled in the negative mode. Also, the non-volatile memory device includes a transfer signal generator 140 for generating the transfer signal CON and a disabling voltage VINA, and a block address decoder 420.

Herein, the global lines GWL<0:N>, GDSL and GSSL and a plurality of high-voltage transistors TR<0:K> correspond to cells included in the cell block 410.

The configurations of the transferor 110, the enabling voltage driver 120, and the disabling voltage driver 130 are similar to those described with reference to FIG. 1. Also, the configuration and operation of the transfer signal generator 140 are similar to those described with reference to FIGS. 1 and 3.

A plurality of cells include a plurality of memory cells MC<0:N>, a plurality of drain selection transistors DST, and a plurality of source selection transistors SST. The global lines include a plurality of global word lines GWL<0:N>, a global drain selection line GDSL, and a global source selection line GSSL. The local lines include a plurality of word lines WL<0:N>, a drain selection line DSL, and a source selection line SSL.

Hereafter, the operation of the control voltage generation circuit is described with reference to FIG. 4.

The high-voltage transistors TR<0:K> are turned on/off in response to the control voltage VOUT inputted through their gates. Herein, the high-voltage transistors TR>0:K> correspond to the high-voltage transistor TR shown in FIG. 1. Hereafter, (1) a case where a non-volatile memory device operates in the normal mode, and (2) a case where a non-volatile memory device operates in the negative mode are described. A part denoted with 'BULK' in each transistor is a part which applies a voltage to a bulk region of a transistor.

(1) A normal mode where a non-volatile memory device operates in the normal mode The normal mode is an operation mode of performing a verification operation or performing a read operation onto the memory cells having a positive threshold voltage after applying a program voltage to the cell block 410 or programming the cell block 410 to have the positive threshold voltage. In the normal mode, the ground voltage VSS is applied to the 'BULK'.

1) A case where the cell block 410 is selected (when the high-voltage transistors TR<0:K> are turned on):

When the cell block 410 is selected based on an address, the block address decoder 420 enables the first enable signal EN1 to a logic high level in response to a block enable signal BLKEN. The subsequent operation is similar to those described with reference to FIG. 1. When the level of the control voltage VOUT becomes the level of the high voltage VPOS through the processes shown in FIG. 1, the high-voltage transistors TR<0:K> are turned on, and the voltages of the global lines GWL<0:N>, GDSL and GSSL are transferred to the local lines WL<0:N>, DSL and SSL inside of the cell block 410.

2) A case where the cell block 410 is not selected (when the high-voltage transistors TR<0:K> are turned off):

When the cell block 410 is not selected based on an address, the block address decoder 420 disables the first enable signal EN1 to a logic high level in response to a block enable signal BLKEN. The subsequent operation is similar to those described with reference to FIG. 1. When the level of the control voltage VOUT becomes the level of the ground voltage VSS through the processes shown in FIG. 1, the high-voltage transistors TR<0:K> are turned on, and the voltages of the global lines GWL<0:N>, GDSL and GSSL are not transferred to the local lines WL<0:N>, DSL and SSL inside of the cell block 410.

(2) A negative mode where a non-volatile memory device operates in the negative mode The negative mode is an operation mode of performing a verification operation or performing a read operation onto the memory cells having a negative threshold voltage after programming the memory cells to have the negative threshold voltage. When the cell block 410 is selected in the negative mode, the ground voltage VSS is applied to the 'BULK'. When the cell block 410 is not selected in the negative mode, the negative voltage VNEG is applied to the 'BULK'. However, when the non-volatile memory device includes a plurality of cell blocks, the high-voltage transistors corresponding to the selected cell block and the high-voltage transistors corresponding to the cell blocks, that are not selected, share the bulk region. In other words, since the same voltage has to be applied to the bulk region shared by the high-voltage transistors corresponding to the selected cell block and the high-voltage transistors corresponding to the cell blocks that are not selected, the negative voltage VNEG may be applied to the 'BULK', not only when the cell block 410 is selected in the negative mode, but also when the cell block 410 is not selected in the negative mode.

1) A case where the cell block 410 is selected (when the high-voltage transistors TR<0:K> are turned on):

The operation in this case is similar to the operation of the non-volatile memory device in the normal mode. When the control voltage VOUT becomes the high voltage level as a result of the operation, the voltages of the global lines GWL<0:N>, GDSL and GSSL are transferred to the local lines WL<0:N>, DSL and SSL in the inside of the cell block 410.

2) A case where the cell block 410 is not selected (when the high-voltage transistors TR<0:K> are turned off):

When the cell block 410 is not selected based on an address, the block address decoder 420 disables the first enable signal EN1 to a logic high level in response to a block enable signal BLKEN. The subsequent operation is similar to those described with reference to FIG. 1. When the level of the control voltage VOUT becomes the level of the negative voltage VNEG through the processes shown in FIG. 1, the high-voltage transistors TR<0:K> are turned off, and the voltages of the global lines GWL<0:N>, GDSL and GSSL are not transferred to the local lines WL<0:N>, DSL and SSL in the inside of the cell block 410. Herein, since a level of a certain global line among the global lines GWL<0:N>, GDSL and GSSL may have the negative voltage VNEG, the level of the control voltage VOUT should change to be the level of the negative voltage VNEG.

Herein, the first high-voltage NMOS transistor HVN1, a second high-voltage NMOS transistor HVN2, and the high-voltage transistors TR<0:K> are triple well transistors. Also, a high-voltage transistor means a transistor which is designed not to be destroyed or damaged although high voltage is applied thereto.

A non-volatile memory device in accordance with another exemplary embodiment of the present invention includes the control voltage generation circuit shown in FIG. 1. Therefore, the control signal VOUT may be any one level of the positive voltage, the ground voltage VSS, and the negative voltage VNEG based on the operation mode and the level of the first enable signal EN1 and the second enable signal EN2 to generate the accurate control voltage VOUT. In particular, the non-volatile memory device makes the control voltage VOUT be the stable negative voltage VNEG in the negative mode so as to effectively prevent the voltages of the global lines GWL<0:N>, GDSL and GSSL from being transferred to the local lines WL<0:N>, DSL and SSL inside of the cell block 410. Also, as the negative voltage VNEG of the output node OUT is transferred to the input node IN, constituent elements such as an inverter 101 may be damaged. The non-volatile memory device in accordance with an exemplary embodiment of the present invention may relieve such concerns by exactly controlling the level of the control voltage VOUT.

This exemplary embodiment of the present invention controls the level of control voltage that controls a high-voltage transistor to be a positive voltage, a ground voltage, and a negative voltage. Therefore, the voltages of a plurality of word lines and a cell block may be electrically connected or disconnected even when the threshold voltage distribution of memory cells includes a negative voltage distribution.

While the present invention has been described with respect to the specific embodiments, it will be apparent to those skilled in the art that various changes and modifications may be made without departing from the spirit and scope of the invention as defined in the following claims.

What is claimed is:

1. A control voltage generation circuit for generating a control voltage for controlling a high-voltage transistor, comprising:
   an input node configured to receive a first enable signal;
   an output node configured to generate the control voltage;
   a transferor configured to transfer a voltage of the input node to the output node in response to a transfer signal;
   an enabling voltage driver configured to drive the output node with a high voltage when the first enable signal is enabled; and
   a disabling voltage driver configured to drive the output node with a negative voltage when a second enable signal is enabled in a negative mode.

2. The control voltage generation circuit of claim 1, wherein, when the output node is driven with a negative voltage, the transfer signal has a negative voltage level.

3. The control voltage generation circuit of claim 2, wherein the disabling voltage driver drives the output node with a ground voltage when the second enable signal is enabled in a normal mode.

4. The control voltage generation circuit of claim 3, wherein the first enable signal is enabled, when the second enable signal is disabled, and the first enable signal is disabled, when the second enable signal is enabled.

5. The control voltage generation circuit of claim 3, wherein a disabling level of the second enable signal is a ground voltage level in the negative mode, and the disabling level of the second enable signal is a negative voltage level in the normal mode.

6. The control voltage generation circuit of claim 3, wherein the transfer signal has a positive voltage level when the first enable signal is enabled, and the transfer signal has a ground voltage level when the output node is driven with the ground voltage level.

7. The control voltage generation circuit of claim 1, wherein the high-voltage transistor is turned on when the first enable signal is enabled, and the high-voltage transistor is turned off when the second enable signal is enabled.

8. The control voltage generation circuit of claim 1, wherein the enabling voltage driver comprises:
   a high-voltage PMOS transistor, coupled to a positive voltage source, which is turned on/off in response to the first enable signal; and
   an NMOS transistor, coupled between the high-voltage PMOS transistor and the output node, which is turned on/off in response to the control voltage.

9. The control voltage generation circuit of claim 1, wherein the transferor comprises a first high-voltage NMOS transistor coupled between the input node and the output node and receives the transfer signal at its gate.

10. The control voltage generation circuit of claim 9, wherein the disabling voltage driver drives the output node to a negative voltage level in the negative mode, and drives the output node to a ground voltage level in the normal mode.

11. The control voltage generation circuit of claim 1, wherein the disabling voltage driver comprises:
    a disabling voltage supply node which receives a disabling voltage; and
    a second high-voltage NMOS transistor coupled between the output node and the disabling voltage supply node and configured to receive the second enable signal at its gate.

12. The control voltage generation circuit of claim 8, further comprising:
    a transfer signal generator configured to generate the transfer signal.

13. A non-volatile memory device, comprising:
    a cell block having a plurality of cells;
    a plurality of global lines;
    a plurality of high-voltage transistors configured to transfer voltages of the global lines to a plurality of local lines inside the cell block;
    an input node configured to receive a first enable signal applied when the cell block is selected;
    an output node configured to generate a control voltage for controlling the high-voltage transistors;
    a transferor configured to transfer a voltage of the input node to the output node in response to a transfer signal;
    an enabling voltage driver configured to drive the output node with a high voltage when the first enable signal is enabled; and
    a disabling voltage driver configured to drive the output node with a negative voltage when a second enable signal is enabled in a negative mode.

14. The non-volatile memory device of claim 13, wherein, when the output node is driven with a negative voltage, the transfer signal has a negative voltage level.

15. The non-volatile memory device of claim 14, wherein the disabling voltage driver drives the output node with a ground voltage when the second enable signal is enabled in a normal mode.

16. The non-volatile memory device of claim 15, wherein the second enable signal is enabled when the cell block is not selected.

17. The non-volatile memory device of claim 15, wherein a disabling level of the second enable signal is a ground voltage level in the negative mode, and the disabling level of the second enable signal is a negative voltage level in the normal mode.

18. The non-volatile memory device of claim 15, wherein the transfer signal has a positive voltage level when the first enable signal is enabled, and the transfer signal has a ground voltage level when the output node is driven with the ground voltage level.

19. The non-volatile memory device of claim 13, wherein the high-voltage transistors are turned on when the cell block is selected, and the high-voltage transistors are turned off when the cell block is not selected.

* * * * *